(12) United States Patent
Osada

(10) Patent No.: US 7,048,553 B2
(45) Date of Patent: May 23, 2006

(54) ELECTRIC CONNECTOR WITH TINE PLATE

(75) Inventor: Tsuyoshi Osada, Yokohama (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/955,724

(22) Filed: Sep. 29, 2004

(65) Prior Publication Data

US 2005/0095883 A1    May 5, 2005

(30) Foreign Application Priority Data

Oct. 31, 2003  (JP)  ............................ 2003-373820

(51) Int. Cl.
*H01R 12/00*    (2006.01)
(52) U.S. Cl. .................................................. 439/79
(58) Field of Classification Search ................ 439/79, 439/80
See application file for complete search history.

(56) References Cited

U.S. PATENT DOCUMENTS

| 5,676,554 | A | * | 10/1997 | Tsuji ............................ 439/79 |
| 5,688,129 | A | * | 11/1997 | Flaherty ........................ 439/79 |
| 5,827,076 | A | * | 10/1998 | Chen ............................ 439/79 |
| 6,062,877 | A | * | 5/2000 | Makino et al. ................. 439/79 |
| 6,171,116 | B1 | * | 1/2001 | Wicks et al. .................. 439/79 |
| 6,319,023 | B1 | * | 11/2001 | Goto et al. .................... 439/79 |
| 6,551,116 | B1 | | 4/2003 | Liu |
| 2003/0166348 | A1 | | 9/2003 | Martin et al. |
| 2003/0176086 | A1 | | 9/2003 | Ogawa et al. |
| 2005/0095882 | A1 | | 5/2005 | Chen et al. |

FOREIGN PATENT DOCUMENTS

| JP | 5-048273 | 6/1993 |
| JP | 09035829 | 2/1997 |
| JP | 10154537 | 6/1998 |
| JP | 11-135204 | 5/1999 |
| WO | WO98/24156 | 6/1998 |

OTHER PUBLICATIONS

JST Corporation, redacted copy of Drawing No. CD1-00115-100 R5, of AIT Connector 34P M-ASSY, dated Jun. 4, 2003.
"Confidential Information and Non-Disclosure Agreement" dated Apr. 25, 2003 between J.S.T. Corporation and DENSO International America, Inc.

* cited by examiner

*Primary Examiner*—Ross Gushi
*Assistant Examiner*—Phuongchi Nguyen
(74) *Attorney, Agent, or Firm*—W. F. Fasse; W. G. Fasse

(57) ABSTRACT

An electric connector includes an insulative housing and a plurality of contacts having on one end a contact leg extending in the height direction and being adapted to be inserted in an insertion hole of a printed circuit board. A tine plate has its largest dimension between both edges in the width direction and has a plurality of through holes for the contact legs to be inserted therein. The insulative housing has bosses on the rear side in the depth direction near the bottom face of the insulative housing at a plurality of points in the width direction. The bosses protrude rearward in the depth direction or on one side in the height direction and are adapted to be fitted on the printed circuit board. The tine plate has a plurality of fitting-on parts adapted to be fitted respectively on the bosses so as to restrain deformation of the tine plate in the width direction.

13 Claims, 4 Drawing Sheets

ELECTRIC CONNECTOR WITH TINE PLATE

BACKGROUND OF THE INVENTION

1. Field of the Invention

The present invention belongs to the field of electric connectors with a tine plate that is to line up the legs of contacts.

2. Related Art

Japanese Patent Unexamined Publication Heisei 9-35829 and counterpart U.S. Pat. No. 5,827,076 disclose a tine plate for an electric connector that comprises a plurality of contacts each having a tine part to be inserted into a through hole of a board and a contacting part to contact a contact of a counterpart mutually-engaging connector, and further comprises a housing having the plurality of contacts arranged therein. The tine plate has a plurality of through holes formed therein for the tine parts of the contacts to be inserted respectively into the through holes. The through holes are arranged in a lining-up position to line up the tine parts by making the tine parts respectively penetrate through the plurality of through holes. The tine plate is characterized in that a slot for interconnecting at least two or more of the through holes is provided.

Japanese Patent Unexamined Publication Heisei 10-154537 discloses a board mount type connector, and this connector is provided with a tine plate. This tine plate has three rows of through holes that correspond to the number of contacts. Some through holes of a row of through holes, which is the closest to the housing among these rows of through holes, are interconnected with each other by slots. With this arrangement, even when there is a difference in coefficient of thermal expansion between a board and the tine plate, stresses that are generated in the soldering parts of the legs are moderated, hence solder cracking does not take place (refer to paragraph 0012 of the publication).

When such a tine plate is mounted on an electric connector, the legs of a plurality of contacts, which substantially extend in parallel to each other, will be neatly lined up by the tine plate, hence when these legs are to be inserted into the insertion holes of a printed circuit board so as to mount the electric connector on the printed circuit board, the workability of this mounting can be enhanced. Moreover, the tine plate can cover and protect the legs of the contacts.

When there is a difference in thermal expansion quantity between a tine plate and a printed circuit board due to a difference in coefficient of thermal expansion, etc. between them, it will pose such a trouble that, due to variations in the service ambient temperature, the tine plate and the legs of the contacts that are soldered onto the printed circuit board interfere with each other, resulting in generation of cracks in the soldering parts of the legs. The inventions of the above-mentioned Japanese Patent Unexamined Publication Heisei 9-35829 and Japanese Patent Unexamined Publication Heisei 10-154537 prevent this trouble by providing the tine plate with slots that interconnect through holes.

SUMMARY OF THE INVENTION

However, if a tine plate is thus provided with slots that interconnect through holes, because slits are formed in the tine plate by through holes and the slots, the strength of the tine plate will be decreased. Moreover, When the tine plate is formed by injection molding or the like, the flow of a molten material will be hindered by molds, pins or the like for forming slots, thus it poses a problem of decrease in the yield of the tine plate.

The present invention was made in view of these points, and its object is to provide an electric connector with a tine plate, wherein the insulative housing of the electric connector is fitted on a printed circuit board, the tine plate is fitted on the insulative housing to restrain the tine plate so that the deformation in the longitudinal direction of the tine plate is made close to the deformation of the printed circuit board, and by this arrangement, independency of the through holes of the tine plate is secured to improve the strength of the tine plate and enhance its moldability and in turn improve its yield while it can reliably prevent the trouble that, due to variations in the service ambient temperature, the tine plate and the legs of the contacts interfere with each other, resulting in generation of cracks in the soldering parts of the legs.

To accomplish the above-mentioned object, with reference to a depth direction, a width direction and a height direction all being perpendicular to each other, the electric connector with a tine plate according to the present invention comprises an electric connector that comprises an insulative housing having one end face in the height direction as a bottom face opposing a printed circuit board facing in the height direction, and a plurality of contacts provided in the insulative housing. Each contact has on one end a leg extending on the rear side in the depth direction of the insulative housing and being configured and arranged to be inserted in an insertion hole penetrating the printed circuit board in the height direction, and on the other end of the contact opposite the leg a contacting part being configured and arranged to contact a contact of a counterpart connector. The inventive assembly further comprises a tine plate facing in the height direction, having the largest distance between both edges in the width directon seen in the height direction, and having a plurality of through holes penetrating in the height direction. The legs of the contacts are inserted in the through holes. The insulative housing is further provided with bosses on the rear side in the depth direction near the bottom face of the insulative housing at a plurality of points in the width direction. The bosses protrude rearward in the depth direction or on one side in the height direction and are configured and arranged to be fitted on the printed circuit board. The tine plate is provided with a plurality of fitting-on parts that are configured and arranged to be fitted respectively on the plurality of bosses so as to restrain the deformation in the width direction.

As the legs of a plurality of contacts, which substantially extend in parallel to each other, will be neatly lined up by the tine plate, hence when these legs are to be inserted into the insertion holes of a printed circuit board so as to mount the electric connector on the printed circuit board, the workability of this mounting can be enhanced. Moreover, the tine plate can cover and protect the legs of the contacts.

When there is a difference in thermal expansion quantity between the tine plate and the printed circuit board due to a difference in coefficient of thermal expansion, etc. between them, as the insulative housing is fitted on the printed circuit board by means of the plurality of bosses, and the tine plate is fitted on the plurality of bosses by means of the respective fitting-on parts so as to be restrained from deforming in the width direction, the deformation of the tine plate in the width direction being the longitudinal direction thereof will be restrained to close to the deformation of the printed circuit board. As a result, even if there are variations in the service ambient temperature, the tine plate and the legs of the contacts that are soldered onto the printed circuit board are restrained or prevented from interfering with each other, thus the trouble of generating cracks in the soldering parts of the legs is avoided. In that case, in comparison with the conventional cases wherein a tine plate is provided with slots that interconnect through holes, the independency of the through holes is secured, hence the strength of the tine plate is enhanced, and moreover, when the tine plate is to be formed by injection molding or the like, the flow of a molten material is hardly held back, thus the yield of the tine plate is improved.

Accordingly, in the electric connector with a tine plate according to the present invention, the insulative housing of the electric connector is fitted on a printed circuit board, the tine plate is fitted on the insulative housing to restrain the tine plate so that the deformation in the longitudinal direction of the tine plate is made close to the deformation of the printed circuit board, hence independency of the through holes of the tine plate is secured to improve the strength of the tine plate and enhance its moldability and in turn improve its yield while it can reliably prevent the trouble that, due to variations in the service ambient temperature, the tine plate and the legs of the contacts interfere with each other, resulting in generation of cracks in the soldering parts of the legs.

In the electric connector with a tine plate according to the present invention, the bosses may be structured to be fitted on a printed circuit board by at least one means of bolting, pinning and soldering.

With this arrangement, the bosses of the insulative housing are fitted on a printed circuit board by at least one of bolt, pin and solder. Thus the bosses of the insulative housing can be fitted on a printed circuit board by a relatively simple process.

In the electric connector with a tine plate according to the present invention, the fitting-on parts of the tine plate may protrude frontward in the depth direction from the front edge in the depth direction of the tine plate and are so provided that they contact the bosses of the insulative housing from the inside, from the outside or from both sides in the width direction of the bosses.

With this arrangement, the fitting-on parts of the tine plate contact the bosses of the insulative housing from the inside, from the outside or from both sides in the width direction of the bosses, and by this, the deformation in the width direction of the tine plate is restrained to come close to the deformation of the printed circuit board. Accordingly, with a relatively simple structure, the deformation in the width direction of the tine plate can be restrained to come close to the deformation of the printed circuit board.

PREFERRED EMBODIMENT OF THE INVENTION

Figure 1:
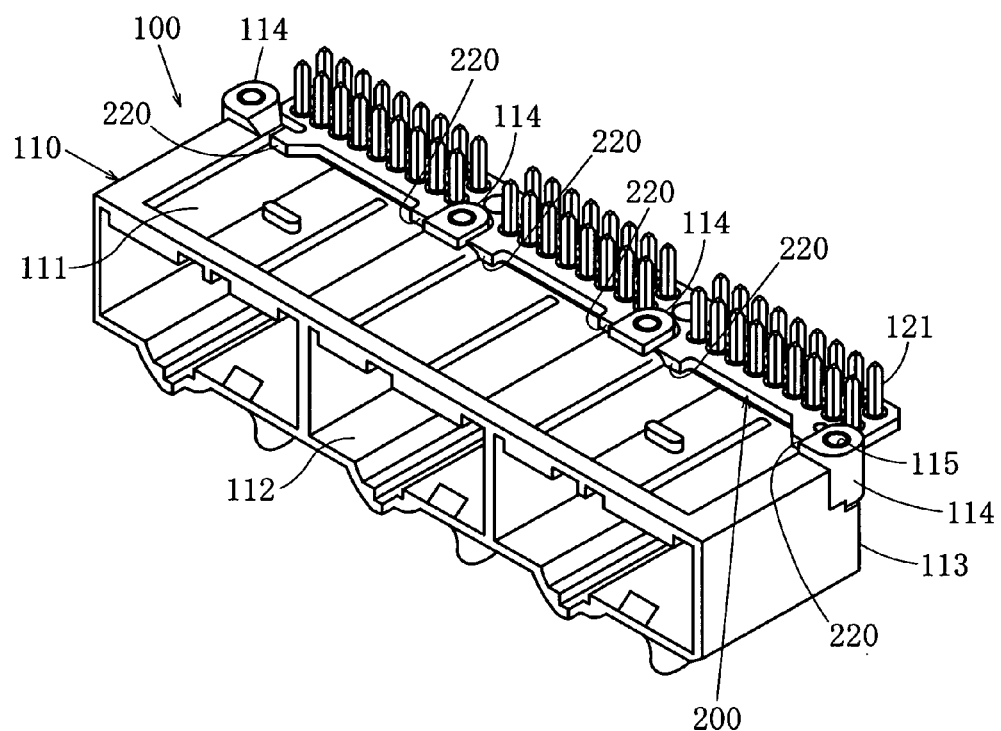
FIG. 1 is a perspective view of the electric connector with a tine plate of the first embodiment seen from the bottom face side.
Figure 2:
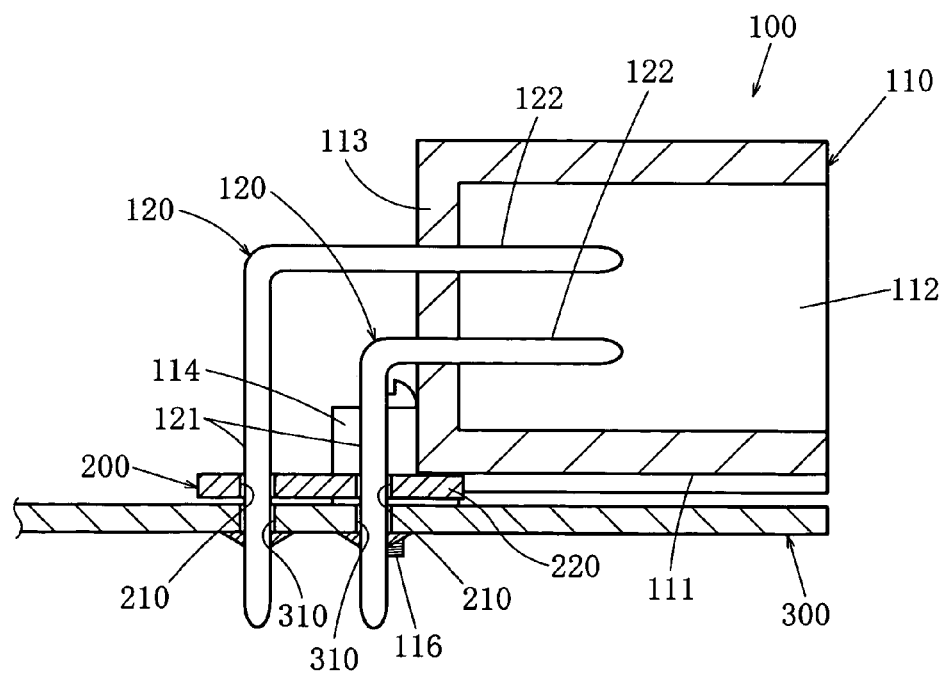
FIG. 2 is a partially sectional view of the electric connector with a tine plate of the first embodiment, which is mounted on a printed circuit board and sectioned by a plane including the center of the contacts.
Figure 3:
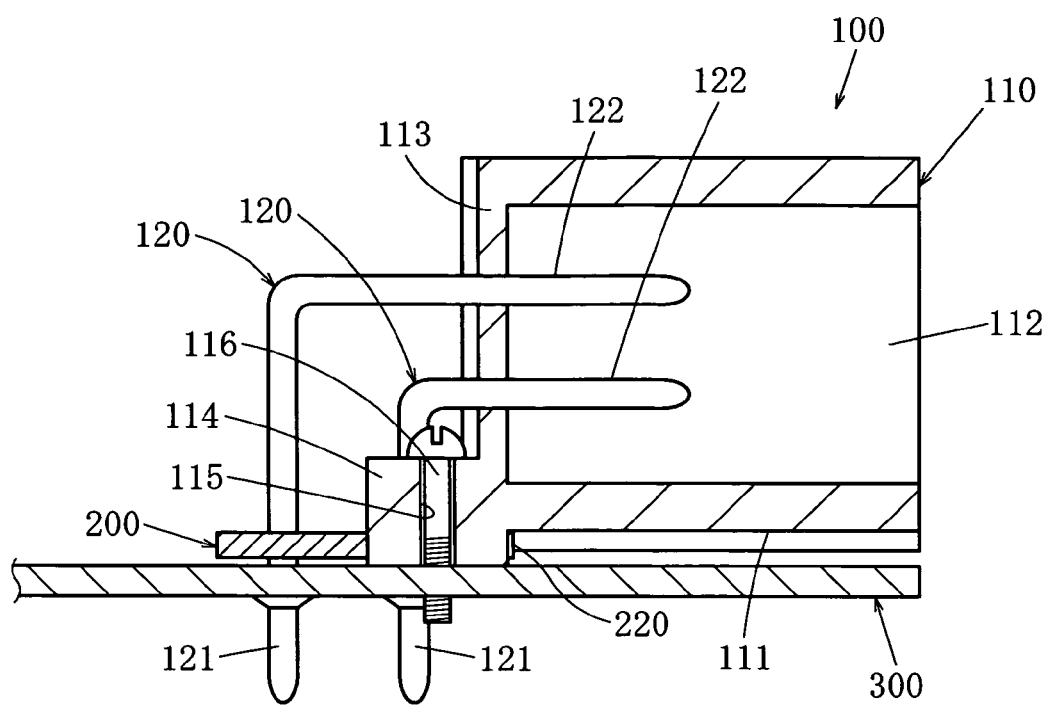
FIG. 3 is partially sectional view of the electric connector with a tine plate of the first embodiment, which is mounted on a printed circuit board and sectioned by a plane including the center of a boss.

In the following, some embodiments of the present invention will be described. FIG. 1 through FIG. 4 show an electric connector with a tine plate being the first embodiment of the present invention. This electric connector with a tine plate comprises an electric connector 100 and a tine plate 200 that is mounted on this electric connector 100. A depth direction, a width direction and a height direction all being perpendicular to each other are assumed and these directions are used for description. In the case of this embodiment, with reference to FIG. 2, the left-right direction of the diagram is the depth direction, and the left in the diagram is the rear in the depth direction, and the right is the front-in the depth direction. The direction perpendicular to the plane of the paper of the diagram is the width direction, and the top-bottom direction of the diagram is the height direction. The electric connector 100 comprises an insulative housing 110 that is made of an insulative material, and a plurality of contacts 120 that are provided in the insulative housing and made of a conductive material. In the insulative housing 110, one end face in the height direction is formed into a bottom face 111 that is to oppose to a printed circuit board 300 facing in the height direction. The contact 120 is provided, at one end, with a leg 121, which extends in the height direction on the rear side in the depth direction of the insulative housing 110 and is to be inserted into an insertion hole 310 penetrating the printed circuit board 300 in the height direction, and on the other end side of the leg 121 a contacting part 122, which is to contact a contact of a counterpart connector (not illustrated). These contacts 120 are provided in the insulative housing 110 in such a way that the legs 121 extend substantially in parallel to each other. A relatively large number of the legs 121 of the contacts 120 are lined up in a direction that is contained in a plane that is substantially perpendicular to the extending direction of the legs 121, and this direction is the longitudinal direction of the group of the contact legs.

In the case of this embodiment, the insulative housing 110 is provided with receiving chambers 112 that open to the front in the depth direction, and the receiving chambers 112 are arranged to receive the counterpart connector. The contact 120 is bent into an L-shape, one end of the contact 120 extends in the height direction to constitute the leg 121, and this leg 121 is arranged to be inserted into an insertion hole 310 of the printed circuit board 300. The other end of the contact 120 extends in the depth direction to penetrate and get fixed in a rear wall 113 that is provided on the rear side of the receiving chamber 112 of the insulative housing 110, and the top end is located inside the receiving chamber 112 to constitute the contacting part 122. The legs 121 of the contacts 120 are lined up in two rows in the depth direction, and twenty-six (26) legs 121 are lined up in the width direction in each row. The contacting parts 122 of the contacts 120 are lined up in two rows in the height direction, and twenty-six (26) contacting parts 122 are lined up in the width direction in each row. Accordingly, in this embodiment, the width direction is the longitudinal direction of the group of contact legs. The electric connector 100 has been described in detail above, however, the number, direction, arrangement, etc. of the contacts of the electric connector with a tine plate according to the present invention are not limited in any way by this embodiment, and the configuration, direction, etc. of the insulative housing are not limited in any way by this embodiment.

Figure 4:
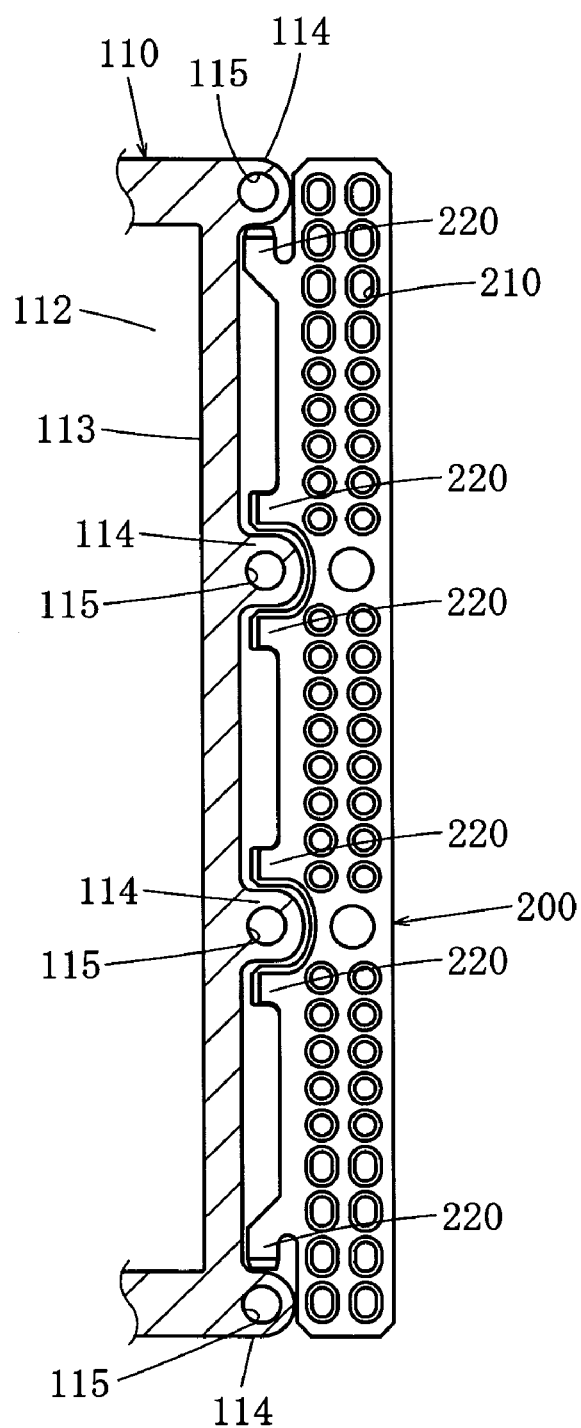
FIG. 4 is a partially sectional view of the electric connector with a tine plate of the first embodiment, which is sectioned by a plane facing in the height direction and from which contacts and bolts are omitted.

The tine plate 200 is made of an insulative material and is formed into a plate shape facing in the height direction, and the height direction is its thickness direction. As shown in FIG. 1 and FIG. 4, the distance between both edges, when seen in the height direction, is the largest in the width direction, and this direction is the longitudinal direction. In other words, according to the layout of the group of the contact legs, the longitudinal direction of the group of the contact legs becomes the longitudinal direction of the tine plate 200. The tine plate 200 is provided with a plurality of through holes 210, which penetrate through the tine plate 200 in the thickness direction and into which the legs 121 of the contacts 120 are inserted.

Figure 5:
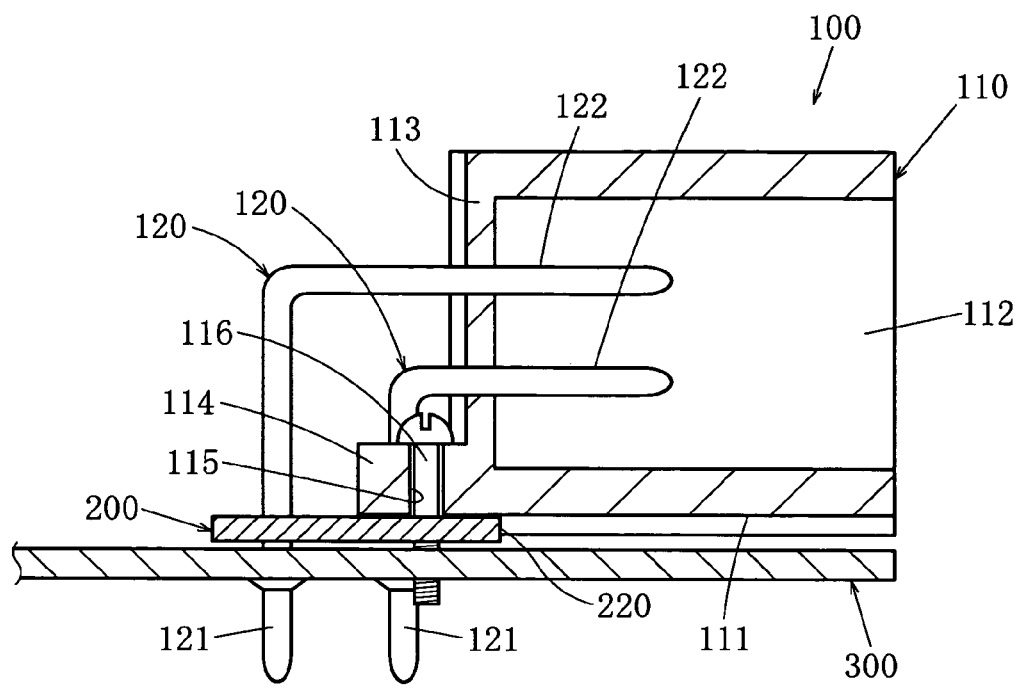
FIG. 5 is partially sectional view of the electric connector with a tine plate of the second embodiment, which is mounted on a printed circuit board and sectioned by a plane including the center of a boss.
Figure 6:
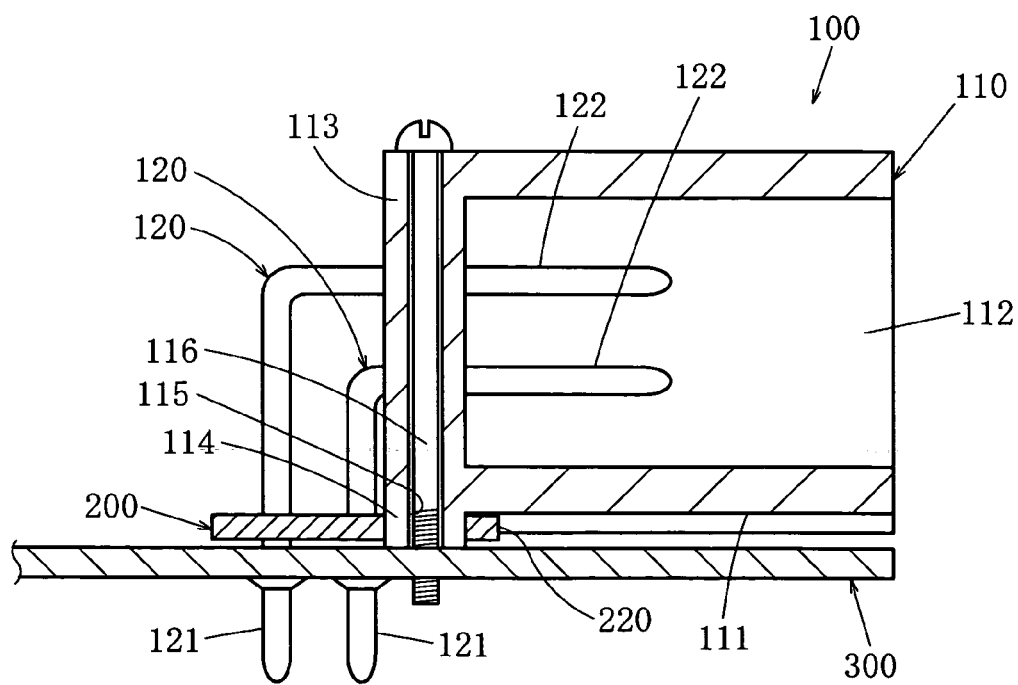
FIG. 6 is partially sectional view of the electric connector with a tine plate of the third embodiment, which is mounted on a printed circuit board and sectioned by a plane including the center of a boss.

The insulative housing 110 is provided, at a plurality of points in the width direction on the rear side in the depth direction near the bottom face thereof, with bosses 114, which protrude rearward in the depth direction or on one side in the height direction and are to be fitted on the printed circuit board 300. In the case of this embodiment, the bosses 114 protrude rearward in the depth direction and also protrude on one side in the height direction, however, the present invention includes, as shown in FIG. 5, the second embodiment wherein the bosses 114 protrude only rearward in the depth direction, and as shown in FIG. 6, the third embodiment wherein the bosses 114 protrude only on one side in the height direction. This one direction in the height direction is a direction of moving away from the bottom face 111 and direction of moving toward the printed circuit board 300. The tine plate 200 is provided with a plurality of fitting-on parts 220, which are to be fitted respectively on the plurality of bosses 114 so that their deformation in the width direction is restrained.

In the case of this embodiment, the bosses 114 are so structured that they are to be fitted on the printed circuit board 300 by bolting. To be more precise, each boss 114 is provided with a bolt hole 115 that penetrates through it in the height direction, and a bolt 116, which is put through or screwed in the bolt hole 115 in the height direction, is screwed in the printed circuit board 300. A nut may be screwed on a bolt 116 that protrudes from the back of the printed circuit board 300. The present invention includes embodiments wherein a boss is to be fitted on a printed circuit board by at least one means of bolting, pinning and soldering. In an embodiment, of bolting, pinning and soldering, a plurality of means may be combined to fit the bosses on a printed circuit board.

In the case of this embodiment, the fitting-on parts 220 of the tine plate 200 are so provided that they protrude frontward in the depth direction from the front edge in the depth direction of the tine plate 200 and contact the bosses 114 of the insulative housing 110 from the inside or from the outside or from both sides in the width direction. To be more precise, as shown in FIG. 1 and FIG. 4, in the case of this embodiment, the first fitting-on parts 220, which are on the inner side in the width direction, protrude from the front edge in the depth direction of the tine plate 200 frontward in the depth direction, having substantially the same thickness of the tine plate 200 and being, two as a set, substantially parallel to the width direction, thus the two first fitting-on parts 220 are so provided that they contact the inner boss 114 of the insulative housing 110 from both sides in the width direction of the boss 114. On the other hand, the second fitting-on parts 220, which are located on the outer sides in the width direction, protrude from the front end in the depth direction of the tine plate 200 frontward in the depth direction, having substantially the same thickness of the tine plate 200, and these fitting-on parts 220 are so arranged that they contact the outer bosses of the insulative housing 110 from the inner side in the width direction of the bosses 114. It does not matter whether the form of fitting-on is divided for the inner side and the outer side in the width direction, and the form of fitting-on between the boss and the fitting-on part of the present invention is not limited by this embodiment. The present invention includes embodiments wherein a fitting-on part that contacts a boss from the inner side in the width direction of the boss is provided, embodiments wherein a fitting-on part that contacts a boss from the outer side in the width direction of the boss is provided, embodiments wherein fitting-on parts that contact a boss from both sides in the width direction of the boss is provided, and embodiments wherein a combination of these fitting-on parts are provided.

Accordingly, as the legs 121 of the plurality of contacts 120, which extend substantially in parallel to each other, will be neatly lined up by the tine plate 200, when these legs 121 are inserted into the insertion holes 310 of the printed circuit board 300 to mount the electric connector 100 on the printed circuit board 300, the workability of the mounting can be enhanced. Moreover, the tine plate 200 can cover and protect the legs 121 of the contacts 120.

When there is a difference in thermal expansion quantity between the tine plate 200 and the printed circuit board 200 due to a difference in coefficient of thermal expansion, etc. between them, as the insulative housing 110 is fitted on the printed circuit board 300 by means of the plurality of bosses 114, and the tine plate 200 is fitted on the plurality of bosses 114 by means of the fitting-on parts 220 so as to be restrained from deforming in the width direction, the deformation of the tine plate 200 in the width direction being the longitudinal direction thereof will be restrained to close to the deformation of the printed circuit board 300. As a result, even if there are variations in the service ambient temperature, the tine plate 200 and the legs 121 of the contacts 120 that are soldered onto the printed circuit board 300 are restrained or prevented from interfering with each other, thus the trouble of generating cracks in the soldering parts of the legs 121 is avoided. In that case, in comparison with the conventional cases wherein a tine plate is provided with slots that interconnect through holes, the independency of the through holes 210 is secured, hence the strength of the tine plate 200 is enhanced, and moreover, when the tine plate 200 is to be formed by injection molding or the like, the flow of a molten material is hardly held back, thus the yield of the tine plate 200 is improved.

The present invention does not limit the means for fitting the bosses on a printed circuit board, however, in the case of the above-mentioned embodiment, the bosses 114 are structured to be fitted on the printed circuit board 300 by at least one means of bolting, pinning and soldering. With this arrangement, the bosses 114 of the insulative housing 110 are fitted on the printed circuit board by at least one of bolt, pin and solder. As a result, the bosses 114 of the insulative housing 110 can be fitted on the printed circuit board by a relatively simple process.

The present invention does not limit the form of the fitting-on parts of the tine plate, however, in the case of the above-mentioned embodiment, the fitting-on parts 220 of the tine plate 200 are so provided that they protrude frontward in the depth direction from the front edge in the depth direction of the tine plate 200 and contact the bosses 114 of the insulative housing 110 from the inside or from the outside or from both sides in the width direction. With this arrangement, the fitting-on parts 220 of the tine plate 200 contact the bosses 114 of the insulative housing 110 from the inside or from the outside or from both sides in the width direction of the bosses 114, and by this, the deformation in the width direction of the tine plate 200 is restrained to make it closer to the deformation of the printed circuit board 300.

The present invention includes embodiments wherein features of the above-mentioned embodiments are combined.

What is claimed is:

1. An electric connector with a tine plate, wherein, with reference to a depth direction, a width direction and a height direction all being perpendicular to each other, said electric connector comprising an insulative housing having one end face in the height direction as a bottom face opposed to a printed circuit board facing in the height direction, and a plurality of contacts provided in the insulative housing, wherein each one of the contacts has, on one end, a contact leg that extends on a rear side in the depth direction of the insulative housing and that is configured to be inserted in an insertion hole penetrating the printed circuit board in the height direction, and wherein each one of the contacts further has, on the other end opposite the contact leg, a contacting part that is configured to contact a contact of a counterpart connector, and said tine plate facing in the height direction, having the largest dimension of said tine plate between both edges in the width direction as seen in the height direction, and having a plurality of through holes penetrating through said tine plate in the height direction, wherein the contact legs are inserted in the through holes, said insulative housing having bosses on the rear side in the depth direction near the bottom face of the insulative housing, respectively at a plurality of points in the width direction, wherein the bosses protrude rearward in the depth direction or on one side in the height direction and the bosses are configured to be fitted on the printed circuit board, and said tine plate having a plurality of fitting-on parts that are configured and arranged to be fitted and are actually fitted and engaged respectively on the plurality of bosses so as to restrain a deformation of the tine plate relative to the insulative housing in the width direction.

2. The electric connector with a tine plate as recited in claim 1, wherein the fitting-on parts of the tine plate protrude frontward in the depth direction from the front edge in the depth direction of the tine plate and are so provided that they contact the bosses of the insulative housing from the inside, from the outside or from both sides in the width direction of the bosses.

3. The electric connector with a tine plate as recited in claim 1, wherein the bosses are structured to be fitted on the printed circuit board by at least one means selected from among bolting, pinning and soldering.

4. The electric connector with a tine plate as recited in claim 3, wherein the fitting-on parts of the tine plate protrude frontward in the depth direction from the front edge in the depth direction of the tine plate and are so provided that they contact the bosses of the insulative housing from the inside, from the outside or from both sides in the width direction of the bosses.

5. An electrical connector assembly comprising:

an electrical connector including an insulative housing and a plurality of electrical contact legs protruding from said housing, wherein said housing includes plural housing walls and plural bosses protruding outwardly in at least one boss protrusion direction from at least one of said walls; and a tine plate comprising a plate of insulating material that has an elongated plate shape with a longest dimension thereof extending in a longitudinal direction perpendicular to said at least one boss protrusion direction, wherein said tine plate has holes penetrating through a thickness of said plate of insulating material, and fitting parts protruding from or recessed into an edge of said plate of insulating material extending along said longitudinal direction;

wherein said tine plate is connected to said electrical connector, with said contact legs inserted in said holes, and with said bosses fittingly engaged and contacted by said fitting parts so that said fitting parts bear against said bosses in said longitudinal direction so as to restrain a relative deformation between said tine plate and said bosses in said longitudinal direction.

6. The electrical connector assembly according to claim 5, wherein said fitting parts contact and bear against sides of said bosses facing inwardly in said longitudinal direction.

7. The electrical connector assembly according to claim 5, wherein said fitting parts contact and bear against sides of said bosses facing outwardly in said longitudinal direction.

8. The electrical connector assembly according to claim 5, wherein said fitting parts contact and bear against first sides of said bosses facing inwardly and second sides of said bosses facing outwardly in said longitudinal direction.

9. The electrical connector assembly according to claim 5, wherein each one of said bosses protrudes from two of said walls in two said boss protrusion directions, of which one boss protrusion direction is parallel to a plane of said tine plate and another boss protrusion direction is parallel to said contact legs.

10. The electrical connector assembly according to claim 5, wherein each one of said bosses protrudes from only one said wall in only one said boss protrusion direction parallel to a plane of said tine plate.

11. The electrical connector assembly according to claim 5, wherein each one of said bosses protrudes from only one said wall in only one said boss protrusion direction parallel to said contact legs.

12. The electrical connector assembly according to claim 5, further comprising a circuit board, wherein said electrical connector is mounted on and connected to said circuit board via said bosses.

13. The electrical connector assembly according to claim 12, wherein said bosses are secured to said circuit board by at least one of a bolt, a pin, or a solder joint.

* * * * *